(12) United States Patent
Jaquette

(10) Patent No.: US 6,580,768 B1
(45) Date of Patent: Jun. 17, 2003

(54) ADAPTIVE MAXIMUM LIKELIHOOD DETECTION

(75) Inventor: Glen Alan Jaquette, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/436,494

(22) Filed: Nov. 9, 1999

(51) Int. Cl.[7] .............................. H03D 1/00; H03D 3/24; G06F 17/18
(52) U.S. Cl. ........................... 375/341; 702/180; 360/53
(58) Field of Search .................................. 375/376, 341; 360/51, 46; 331/17; 341/131; 369/59.21, 47.17

(56) References Cited

U.S. PATENT DOCUMENTS

| | | | |
|---|---|---|---|
| 4,945,538 A | 7/1990 | Patel | 371/43 |
| 5,321,559 A | 6/1994 | Nguyen et al. | 360/46 |
| 5,381,359 A | 1/1995 | Abbott et al. | 364/724.19 |
| 5,490,091 A | * 2/1996 | Kogan et al. | 702/180 |
| 5,563,746 A | 10/1996 | Bliss | 360/53 |
| 5,579,340 A | 11/1996 | Tokuriki et al. | 375/232 |
| 5,585,975 A | 12/1996 | Bliss | 360/65 |
| 5,619,539 A | 4/1997 | Coker et al. | 375/341 |
| 5,654,667 A | 8/1997 | Adachi | 329/306 |
| 6,424,686 B1 | * 7/2002 | Hutchins et al. | 375/341 |

FOREIGN PATENT DOCUMENTS

WO    99/49633 A2    9/1999    ........... H04L/27/01

* cited by examiner

Primary Examiner—Stephen Chin
Assistant Examiner—Edith Yeh
(74) Attorney, Agent, or Firm—John H. Holcombe

(57) ABSTRACT

An adapter and a method for adapting a programmable digital maximum likelihood detector to a variable channel output and a calibration system for calibrating a programmable digital maximum likelihood detector from unknown data in a known code at a variable channel output, the maximum likelihood detector having a number of maximum likelihood states. A detector detects a digital sample of the recorded analog signals as corresponding to one of the maximum likelihood states. An accumulator partially accumulates the detected digital sample with prior detected digital samples corresponding to the one of the maximum likelihood states. Logic coupled to the accumulator employs the accumulated digital samples for the corresponding maximum likelihood state to determine at least one numerical metric coefficient matching the digital samples to the one of the maximum likelihood states, and updates or sets the numerical metric coefficient.

50 Claims, 8 Drawing Sheets if CSD0=0, CSD1=0, then $DJ_k = g_6 y_k + P_6$ (case 3)
if CSD0=0, CSD1=1, then $DJ_k = -DJ_{k-1} + g_5 y_k + P_5$ (case 2)
if CSD0=1, CSD1=0, then $DJ_k = DJ_{k-1} + g_3 y_k + P_3$ (case 0)
if CSD0=1, CSD1=1, then $DJ_k = g_4 y_k + P_4$ (case 1)

ADAPTIVE MAXIMUM LIKELIHOOD DETECTION

DOCUMENTS INCORPORATED BY REFERENCE

Commonly assigned U.S. patent application Ser. No. 09/282,419, Hutchins et al., is incorporated for its showing of programmed metric coefficients for maximum likelihood detection of data recorded as analog signals, and commonly assigned U.S. Pat. No. No. 6,424,686, Hutchins et al., is incorporated for its showing of difference metrics employed in the maximum likelihood detection of the '419 application.

TECHNICAL FIELD

This invention relates to maximum likelihood detection of data recorded as analog signals representing a finite number of states, and, more particularly, to adapting maximum likelihood detection to handle variable data channels.

BACKGROUND OF THE INVENTION

Maximum likelihood detection of data recorded as analog signals and detected from partial response samples is highly advantageous in magnetic disk drives, where the disks and heads are fixed and non-removable. The characteristics of the channel are fixed, including the particular disk media, the particular recording and read heads, the linear velocity and flying height between the disk media and the recording and read heads, and the recording and read electronics. The channel characteristics can be measured and, once known, tend to remain constant.

With constant channel characteristics, the detection capability of maximum likelihood detection can be designed so as to be highly error free. The received partial response samples are equalized so that the signals provided to the maximum likelihood detector tend to precisely match the expected signals.

Additionally, a specific code may be employed which maximizes the distances between the sensed states. Only limited changes are taken into account, such as differences in data rates between inner and outer tracks, minor servo offtrack operation, minor disk defects, and some head wear over time. Thus, a specific maximum likelihood detection circuit can be designed which is specific to the type of disk drive and which will have a low error rate at high recording densities. Further, such minor changes have been accommodated by employing digital FIR (finite impulse response) filters whose coefficients are programmable, thus changing the frequency response of the filters to better equalize the signal being read to match the maximum likelihood detector. Examples include, U.S. Pat. No. 5,321,559, Nguyen et al., U.S. Pat. No. 5,365,342, Abbott et al., and U.S. Pat. No. 5,442,760, Abbott et al.

It becomes more difficult to use such maximum likelihood detection with recording devices which have removable media.

Removable media devices tend to be mass storage devices which allow data to be recorded on portable media that is removed from the device and stored elsewhere, such as in the storage shelves of an automated data storage library, or in true archive storage outside of a drive or library on storage shelves or in boxes and other containers. The amount of data so stored quickly becomes very large and, if a new and upgraded portable media is introduced, there is a desire on the part of the user to resist re-recording all of the archived data onto the upgraded portable media. Hence, a backwards compatibility is typically required for removable media devices.

The characteristics of portable media thus vary between the types of media, but also tend to vary between ones of the same type of media, and within the same media.

Examples of removable media devices include optical disk and optical tape storage, which may be read-only, write-once, and rewritable media, and be different types of media, such as molded, magneto-optic and phase-change media.

Optical media is subject to variation from media to media in recorded data output characteristics based on the type of media, above, variation in media materials between manufacturers and over time, and between recording densities. Optical media is also subject to change as the recording moves between tracks, where the effective head to track speed may change, or as the recording moves from one side of the disk to another, where the effective head to disk surface angle may be tilted.

Another example of removable media devices includes magnetic tape recording, which have media to media variation based on different data densities on the same type of media, different types of media such as chromium-based, nickel-based, ferrous-based media, or between materials used by different manufacturers. Additionally, tape media may have differing thicknesses and therefore differing media to head (flying and contact) characteristics over the recording and read head, resulting in differing head to media spacings. The tape media may also fly at differing head to media spacings as the tape moves from one reel to the next and the tension or angle of the tape to the head varies. Further, the flying characteristics of the tape media may vary as the tape head is moved from one side of the tape to tracks at the other side of the tape.

Maximum likelihood detection in such differing circumstances is exceedingly difficult, and may require a different maximum likelihood detector for each circumstance.

The incorporated Hutchins et al. '019 and '020 applications provide maximum likelihood detectors which allow the programming, or setting, of numerical metric coefficients, adjusting the response of the maximum likelihood detector. The coefficients are preferably derived from the difference between metrics directly associating "0" and "1" states of the recorded signal. The coefficients are respectively applied to each digital sample to generate alternative metrics, and each respective alternative metric is compared to a previous metric. Based on the comparison, one of a plurality of provided metrics is selected which remains within defined positive and negative bounds. Then, the one of the finite number of states represented by the selected metric is identified, and in response to the identified one of the finite states, a maximum likelihood state detector is incremented to a maximum likelihood state dictated by the identified one of the finite states, the incremented maximum likelihood state detects the recorded analog signals.

The numerical metric coefficients of the maximum likelihood detector are based on sample "cases" which are derived from sample outputs for expected waveforms of a particular media, and the metric coefficient numerical values are calculated for the expected sample outputs. Specifically, the sample outputs of the expected waveforms are determined, for example, by measuring a number of actual outputs for sample points of the waveforms, and calculating the mean values of each of the sample points, and the metric coefficient numerical values are calculated for the mean values of the sample outputs, thereby providing the numerical metric coefficients. The equations for deriving the metric coefficients minimize the mean squared error between the received signal and the ideal signal, which is the noise-free signal.

Once determined, the numerical metric coefficients are stored in a lookup table and selected when the portable media having the characteristics is identified as loaded into the device. A portable removable media may be identified externally by a label, or internally by reading a memory chip, reading a universal modulated code from the media, or the first few bytes of the media to be read may have more universal characters which are easily read which identify the media.

A media detector may comprise an optical reader or scanner for reading a label, a wireless interface for reading a chip, or may comprise logic associated with the read channel, and, the numerical metric coefficients are selected from the lookup table for the detected media.

Thus, the numerical coefficients for the specific media must be known in advance, and the predetermined numerical coefficients must be stored and available for use. Further, the characteristics of the specific media must not be variable, so that the same numerical coefficients may be used for the media without change.

However, as discussed above, optical media is subject to change as the recording moves between tracks, where the effective head to track speed may change, or as the recording moves from one side of the disk to another, where the effective head to disk surface angle may be tilted. Tape media may fly at differing head to media spacings as the tape moves from one reel to the next and the tension or angle of the tape to the. head varies. Further, the flying characteristics of the tape media may vary as the tape head is moved from one side of the tape to tracks at the other side of the tape.

Further, the specific portable removable media may not have an identification character that may be read to identify the media and select predetermined numerical coefficients.

Even if the media is identified, the read/write interface may change. For example, the single biggest change in a tape read/write interface is due to head wear. Tapes will cause abrasion to the head, eroding the MR read head material, whereas the metallic pole tips of the write element are not eroded as much. The net result is that the transfer function changes and differs from tape to tape depending on the age of a tape head when the data was written and the age of a same or different (different drive) tape head when the data is read.

SUMMARY OF THE INVENTION

It is an object of the present invention to provide adaptable maximum likelihood detection.

Another object of the present invention is to provide maximum likelihood detection for media whose precise characteristics are unknown so that there are no predetermined numerical coefficients.

Disclosed are an adapter and a method for adapting a programmable digital maximum likelihood detector to a variable channel output and a calibration system for calibrating a programmable digital maximum likelihood detector from unknown data in a known code at a variable channel output. The maximum likelihood detector is that of the incorporated Hutchins et al. '019 and '020 applications and detects digital samples of data recorded as analog signals representing a finite number of maximum likelihood states in accordance with a finite number of maximum likelihood sample-to-sample path cases. However, the digital samples represent the variable channel output of the recorded analog signals at a predetermined timing with respect thereto. In the incorporated Hutchins et al. applications, the detector comprises a sample input for receiving the digital samples of the recorded analog signals, and programming sources for providing numerical metric coefficients. Sample logic applies the programmed numerical metric coefficients to each of the digital samples to generate alternative metrics. Relational logic provides a previous metric which comprises a difference metric function of a previous digital sample derived from difference metrics representing the difference between metrics directly associating "0" and "1" states of the recorded signal. The one of the respective generated alternative metrics is selected which minimizes the mean squared error with respect to the previous metric and a maximum likelihood path memory identifies the maximum likelihood case represented by the selected metric, the set maximum likelihood case of the path memory state detecting the recorded analog signals.

The adapter comprises a detector identifying the maximum likelihood state corresponding to a digital sample of the recorded analog signals; an accumulator coupled to the detector for partially accumulating the detected digital sample with prior detected digital samples corresponding to the maximum likelihood state; and logic coupled to the accumulator and to the programming sources, employing the accumulated digital samples for the corresponding maximum likelihood state to determine and/or update the numerical metric coefficient for the maximum likelihood state.

The calibration system comprises a detector detecting digital samples of the recorded analog signals corresponding to one of the maximum likelihood states; an accumulator coupled to the detector for partially accumulating the detected digital samples for the corresponding maximum likelihood states; and logic coupled to the accumulator and to the programming sources, employing the accumulated digital samples for the corresponding maximum likelihood states to determine the numerical metric coefficients matching the digital samples to the one of the maximum likelihood states and setting the provided numerical metric coefficient to a value related to the determined matching numerical coefficient.

For a fuller understanding of the present invention, reference should be made to the following detailed description taken in conjunction with the accompanying drawings.

DETAILED DESCRIPTION OF THE INVENTION

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
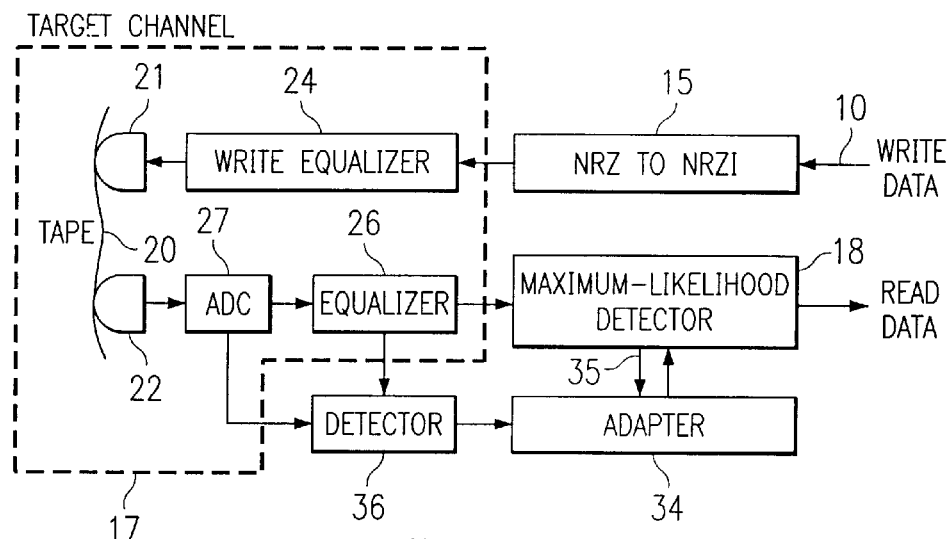
FIG. 1 is a diagrammatic representation of a channel implementing the present invention.
Figure 2:
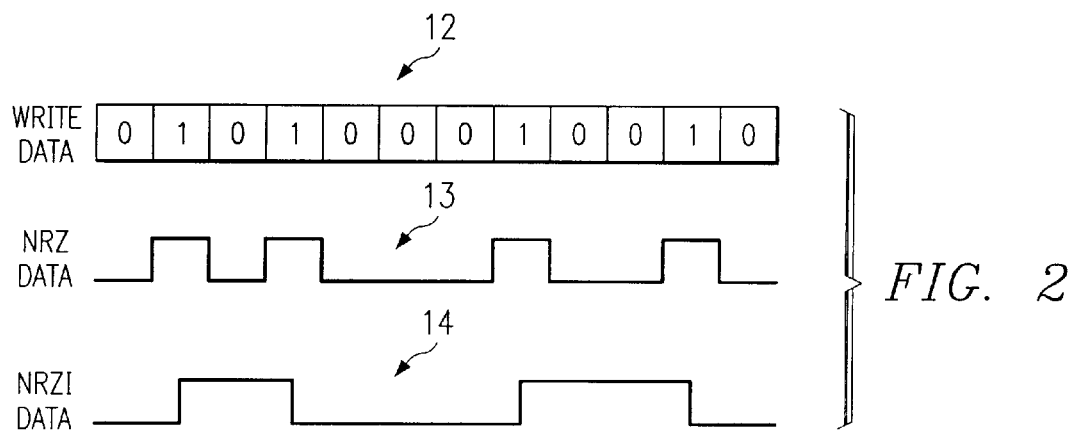
FIG. 2 is a representation of a stream of write data and its corresponding representation in NRZ and NRZI.

Referring to FIGS. 1 and 2, a write-read channel is illustrated in FIG. 1 that implements the present invention for adaptive/calibration of maximum likelihood detection of write data, such as that illustrated in FIG. 2, as supplied at an input 10. Typical binary data 12 is signaled as NRZ data 13, having a signal voltage for each one bit and no (or another) signal voltage for each zero bit. When binary data is to be recorded on data storage media, the data is typically converted to a recording format, such as NRZI data 14 by circuit 15 and supplied to a target channel 17. Thus, it is this NRZI data that a maximum likelihood detector 18 must use to base its reconstruction of the write data 12.

The typical target channel 17 is designed to reproduce the data as faithfully as possible within reasonable cost constraints. Although a tape system employing a tape media 20 and write and read heads 21 and 22 is illustrated, optical or magnetic disk systems may also be employed. In any of the systems, a write equalizer 24 and a read equalizer 26 are employed to offset to some extent certain non-linearities of the media and drive systems and to provide the read signals at the same amplitude. In maximum likelihood detection systems, the received output signal is typically first equalized by a read equalizer 26. If the read equalizer 26 is digital, an analog to digital converter 27 is employed to provide the digital samples of the output of the read head 22. The analog to digital converter 27 includes a clock recovery circuit and interpolation logic to interpolate between the actual samples to provide digital samples which have the correct timing.

Figure 3:
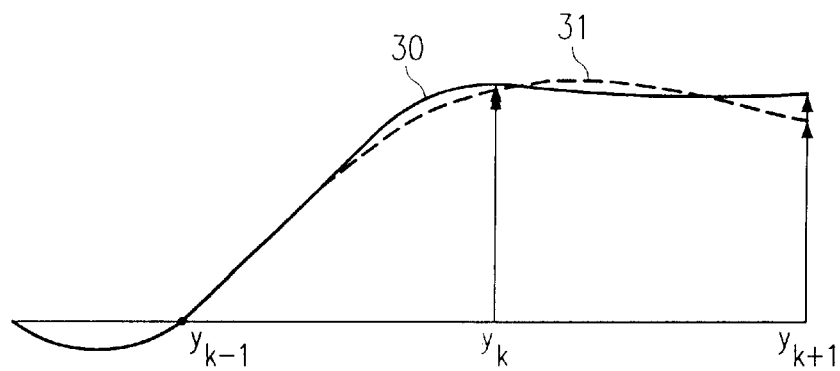
FIG. 3 is a diagram of channel step response curves for a recorded signal of FIG. 2 including samples of the signal for first order detection.

FIG. 3 illustrates an idealized class PRI step response curve 30, and a non-ideal step response 31, which transition between a positive amplitude state, called a "1" state, and a null amplitude state, called a "0" state, and illustrates idealized timing of the first order digital sample points, where "$y_k$" represents the present digital sample, "$y_{k-1}$" represents the previous digital sample, and "$y_{k+1}$" represents the next digital sample. The ideal digital sample points are selected to be at a uniform clock rate at a multiple of the clock rate of the recorded data. The analog signal received by the analog to digital converter will resemble a sine wave more than the input square wave, and can be perturbed by noise signals. The actual samples taken are typically at a clock frequency not synchronized with the underlying bit boundaries of the recorded signal, instead a phase-locked loop (PLL) phase locks to the detected data and restores (generates) this clock. In the case of a digital PLL it is essentially a calculation of a synthetic clock period. The signal samples are then interpolated to estimate the signal at the synthetic clock rate. The output of this interpolation is the new sample stream $y_k$, which is valid at each synthetic clock period, thus $y_k$ is typically sent out on a data bus which has a corresponding valid signal, and they are both clocked at the original sample clock rate.

The resultant sample often bears little resemblance to the idealized digital sample "$y_k$" for curve 30. Maximum likelihood detection has proven effective in interpreting the detected samples for decoding the data with a minimum of errors by basing the determination of each digital sample value on the detected pattern of samples which includes the present sample.

Figure 4:
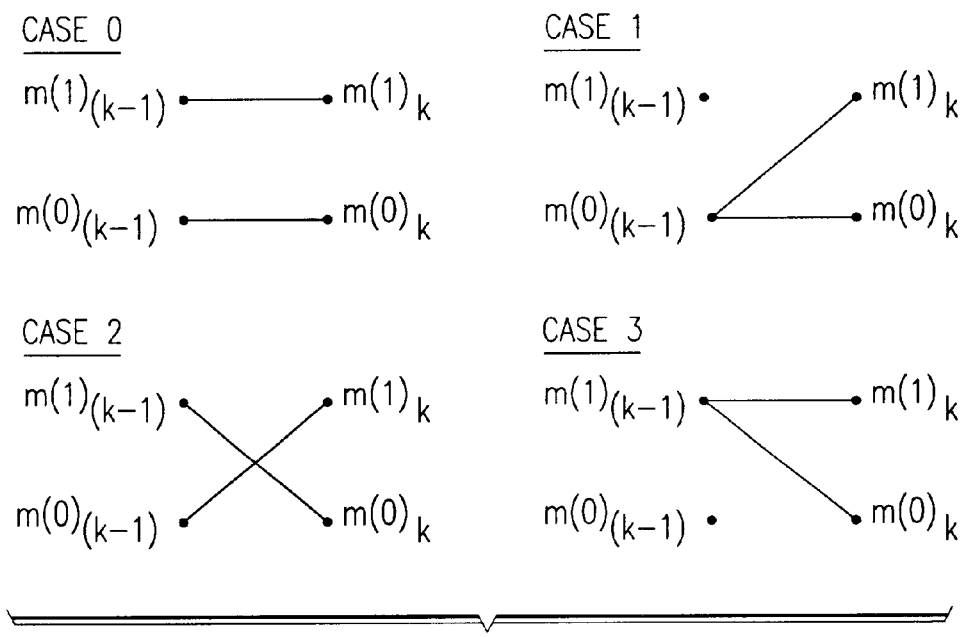
FIG. 4 is a diagram of an example of a maximum likelihood trellis branching from one sample to the next for first order detection.

The first order maximum likelihood detection of digital samples of data recorded as analog input signals 14 of FIG. 2, and illustrated as having an examplary output of FIG. 3, is illustrated in FIG. 4, showing the possible maximum likelihood trellis branching from one sample to the next for first order detection of the "0" and "1" states of the recorded signal. In the example of FIG. 4, in accordance with the incorporated Hutchins et al. '419 and '420 applications, the $\mu$ values used to calculate g and P, the factors in the metric calculations, for Cases "0", "1", "2" and "3" is determined for a particular media for a particular read head by determining (e.g., by calculation or measurement) the mean value for each point. The mean values are then employed in metric equations to assess the various Cases and then the equations are solved to determine particular metric coefficients, which in the normal case of removable media signals 14 do not have the idealized relationship of the signals 30.

Idealized classes allow simplified maximum likelihood detection by having digital samples that are integrally related so that it is easy to calculate the appropriate metrics. As described above, maximum likelihood detection of magnetic disk drives, where the disks and heads are fixed and non-removable can have the equalizers 24 and 26 of FIG. 1 designed so that the idealized signals are provided to the maximum likelihood detector.

As discussed above, removable media may vary substantially in characteristics. The incorporated Hutchins et al. '419 and '420 applications provide maximum likelihood detectors which allow the programming, or setting, of numerical metric coefficients, adjusting the response of the maximum likelihood detector to the different characteristics of different removable media. In the incorporated Hutchins et al. '419 and '420 applications, different mean values are determined for each of various portable data storage media that are likely to be loaded into the data storage drive, and the coefficients are determined from the mean values. The coefficients are stored in a lookup table and are provided to the maximum likelihood detector when the media of that type is identified as loaded into the data storage drive.

FIGS. 3 and 4 illustrate exemplary idealized class PR I step response curves 30 and first order samples, and non-ideal cases 31 for detection of the first order samples, such as may be encountered in an optical storage system. As is discussed in the incorporated Hutchins et al. '419 and '420 applications, other encoding and sampling systems are also employed, such as class PR II encoding and second order samples, as may be encountered in an optical storage system, such as class PR IV encoding and second order samples, and such as class Extended PR IV encoding and third order samples, as may be encountered in a magnetic disk or tape storage system.

For the purpose of disclosing the present invention, the first order class PR I detection will be described, and one of skill in the art will be able to extrapolate to other maximum likelihood detection systems.

Per the incorporated Hutchins et al. '419 and '420 applications, the channel sample $y_k$ of a PRI system is the function of input bits $a_k$, and $a_{k-1}$. The goal of the maximum likelihood detector is to produce an accurate estimate of the channel input sequence $\{a_k\}$ by observing the pulse amplitude modulated sequence $\{y_k\}$. The maximum likelihood detector does this by maximizing the likelihood function $p(y_k|s_0; \{a_k\}) = p(y_k|s_k; \{a_k\})$, where $s_0$=the initial state, and $s_k$=the current state. The probability of the given output sample at time k depends only upon the current state of the system and the possible input $a_k \in \{0,1\}$. The total likelihood function can be described as:

$$p(y_k|s_0; \{a_k\}) = \pi_k \, p(y_k|s_k; \{a_k\}).$$

For this system, at any time k, there are two metrics:

$$(m(0))_k = \text{maximum} : \begin{array}{l} m(0)_{k-1} + \ln[p(y_k \mid s_k = 0; a_0)] \\ m(1)_{k-1} + \ln[p(y_k \mid s_k = 1; a_0)] \end{array}$$

$$(m(1))_k = \text{maximum} : \begin{array}{l} m(0)_{k-1} + \ln[p(y_k \mid s_k = 0; a_1)] \\ m(1)_{k-1} + \ln[p(y_k \mid s_k = 1; a_1)] \end{array}$$

where $s_k=0$ if $a_{k-1}=a_0$ and $s_k=1$ if $a_{k-1}=a\mathbf{1}$.

Referring to FIG. 4, for the first order maximum likelihood detector, there are four ways that the trellis diagram can branch from one sampling time to the next, respectively called "Case 0", "Case 1", "Case 2", and "Case 3".

As discussed in the incorporated Hutchins et al. '419 and '420 applications, the metric coefficients of the difference metrics are derived, employing the "cases" of FIG. 4.

Thus, employing difference metrics:

1. For Case 0 to have occurred:

$$m(0)_k + 2\mu_0 y_k - \mu_0^2 > m(1)_{k-1} + 2\mu_1 y_k - \mu_1^2$$

$$m(0)_k + 2\mu_2 y_k - \mu_2^2 < m(1)_{k-1} + 2\mu_3 y_k - \mu_3^2$$

Defining $DJ_k = m(\mathbf{1})_k - m(\mathbf{0})_k$ if $DJ_{k-1} < 2(\mu_0 - \mu_1)y_k + (-\mu_0^2 + \mu_1^2)$;

and $DJ_{k-1} > 2(\mu_2 - \mu_3)y_k + (-\mu_2^2 + \mu_3^2)$;

then Case 0 has occurred and $DJ_k = DJ_{k-1}\, 2(\mu_3 - \mu_0)y_k + (-\mu_3^2 + \mu_0^2)$;

Defining:
where $g_1 = 2(\mu_0 - \mu_1)$ and $P_1 = -\mu_0^2 + \mu_1^2$, where $g_2 = 2(\mu_2 - \mu_3)$ and $P_2 = -\mu_2^2 + \mu_3^2$, where $g_3 = 2(\mu_3 - \mu_0)$ and $P_3 = -\mu_3^2 + \mu_0^2$;

so that $DJ_{k-1} < g_1 y_k + P_1$; and $DJ_{k-1} > g_2 y_k + P_2$;

then, Case 0 has occurred, so that $Dj_k = DJ_{k-1} + g_3 y_k + P_3$.

2. If $DJ_{k-1} < 2(\mu_0 - \mu_1)y_k + (-\mu_0^2 + \mu_1^2)$;

and $DJ_{k-1} < 2(\mu_2 - \mu_3)y_k + (-\mu_2^2 + \mu_3^2)$;

then Case 1 has occurred and $DJ_k = 2(\mu_2 - \mu_0)y_k + (-\mu_2^2 + \mu_0^2)$;

Defining:
where $g_1 = 2(\mu_0 - \mu_1)$ and $P_1 = -\mu_0^2 + \mu_1^2$, where $g_2 = 2(\mu_2 - \mu_3)$ and $P_2 = -\mu_2^2 + \mu_3^2$, where $g_4 = 2(\mu_2 - \mu_0)$ and $P_4 = -\mu_2^2 + \mu_0^2$;

so that $DJ_{k-1} < g_1 y_k + P_1$; and $DJ_{k-1} < g_2 y_k + P_2$;

then, Case 1 has occurred, so that $DJ_k = g_4 y_k + P_4$.

3. If $DJ_{k-1} > 2(\mu_0 - \mu_1)y_k + (-\mu_0^2 + \mu_1^2)$;

and $DJ_{k-1} < 2(\mu_2 - \mu_3)y_k + (-\mu_2^2 + \mu_3^2)$;

then Case 2 has occurred and $DJ_k = -Dj_{k-1} + 2(\mu_2 - \mu_1)y_k + (-\mu_2^2 + \mu_1^2)$ Defining:
where $g_1 = 2(\mu_0 - \mu_1)$ and $P_1 = -\mu_0^2 + \mu_1^2$, where $g_2 = 2(\mu_2 - \mu_3)$ and $P_2 = -\mu_2^2 + \mu_3^2$, where $g_5 = 2(\mu_2 - \mu_1)$ and $P_5 = -\mu_2^2 + \mu_1^2$;

so that $DJ_{k-1} > g_1 y_k + P_1$; and $DJ_{k-1} < g_2 y_k + P_2$;

then Case 2 has occurred, so that $Dj_k = -Dj_{k-1} + g_5 y_k + P_5$.

4. If $DJ_{k-1} > 2(\mu_0 - \mu_1)y_k + (-\mu_0^2 + \mu_1^2)$;

and $DJ_{k-1} > 2(\mu_2 - \mu_3)y_k + (-\mu_2^2 + \mu_3^2)$;

then Case 3 has occurred and $DJ_k = 2(\mu_3 - \mu_1)y_k + (-\mu_3^2 + \mu_1^2)$;

Defining:
where $g_1 = 2(\mu_0 - \mu_1)$ and $P_1 = -\mu_0^2 + \mu_1^2$, where $g_2 = 2(\mu_2 - \mu_3)$ and $P_2 = -\mu_2^2 + \mu_3^2$, where $g_6=2(\mu_3-\mu_1)$ and $P_6=-\mu_3^2+\mu_1^2$;

so that $DJ_{k-1}>g_1y_k+P_1$; and $DJ_{k-1}>g_2y_k+P_2$;

then Case 3 has occurred, so that $Dj_k=g_6y_k+P_6$.

The sample outputs of the expected waveforms are determined in the incorporated Hutchins et al. '419 and '420 applications by measuring a number of sample outputs for the waveforms, and calculating the mean values of each of the sample points. The metric coefficient numerical values are then calculated for the mean values of the sample outputs, thereby providing the numerical metric coefficients.

Thus, the metric coefficients are derived from the difference between metrics directly associating "0" and "1" states of the recorded signal.

The calculated numerical coefficients for a particular type of portable data storage media are stored in a lookup table and provided to the maximum likelihood detector when the type of media is identified as loaded into the device. A portable removable media may be identified, for example, externally by a label, or internally by reading a memory chip, reading a universal modulated code from the media, or the first few bytes of the media to be read may have more universal characters which are easily read which identify the media. A media detector may, for example comprise an optical reader or scanner in a library for reading a label, a wireless interface for reading a chip, or may comprise logic associated with the read channel, or, if in a library, the library will know the media type when selecting the media. Then, employing the media identity, the numerical metric coefficients are selected from the lookup table for the detected media.

Thus, the numerical coefficients for the specific media must be known in advance, and the predetermined numerical coefficients must be stored and available for use. Further, the characteristics of the specific media must not be variable, so that the same numerical coefficients may be used for the media without change.

However, as discussed above, optical media is subject to change as the recording moves between tracks, where the effective head to track speed may change, or as the disk rotates, the effective head to media surface angle may tilt. Tape media may fly at differing head to media spacings as the tape moves from one reel to the next and the tension or angle of the tape to the head varies. Further, the flying characteristics of the tape media may vary as the tape head is moved from one side of the tape to tracks at the other side of the tape. Further, the specific portable removable media may not have an identification character that may be read to identify the media and select predetermined numerical coefficients.

Figure 5:
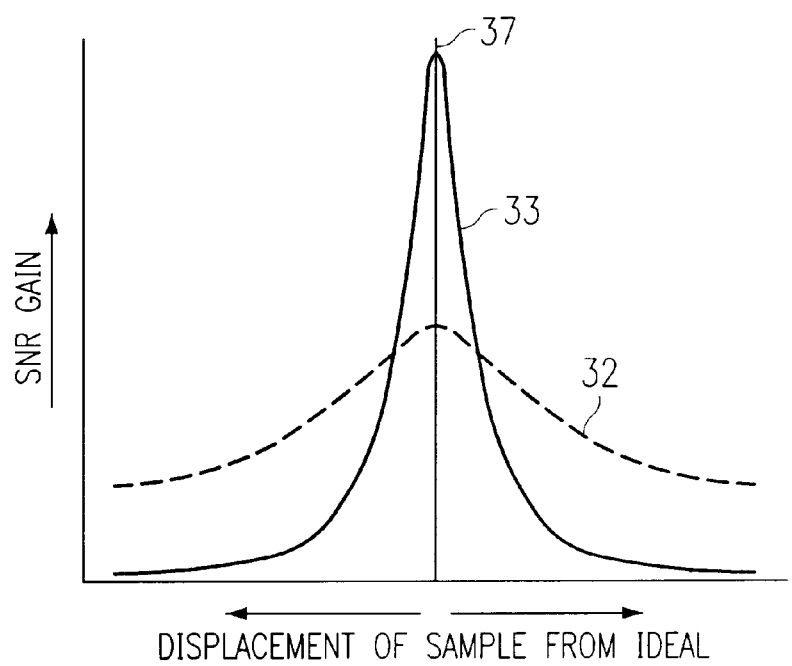
FIG. 5 is a diagram of an example of signal to noise characteristics of maximum likelihood detection and of peak detection.

Referring to FIG. 5, an example of signal to noise characteristics (SNR gain versus displacement of the sample from ideal 37) of maximum likelihood detection 33 and an example of signal to noise characteristics of digital peak detection 32 are illustrated. The SNR gain characteristics illustrate that the accuracy of maximum likelihood detection 33 is significantly greater than that of peak detection 32 when the digital samples are near the expected amplitude 37. This is the reason that maximum likelihood detection is highly desirable when it can be used.

However, maximum likelihood detection 33 has a higher error rate and is less efficient if the digital samples are not at or near the expected amplitude 37. Thus, maximum likelihood detection has not been used in systems where the channel is highly variable or where the needed predetermined numerical coefficients are unavailable.

The present invention both provides adaptable maximum likelihood detection for a variable channel, and provides maximum likelihood detection for media whose precise characteristics are unknown and where there are no predetermined numerical coefficients.

Still referring to FIG. 5, digital peak detection 32, employed primarily with magnetic tape, or threshold detection, employed primarily with optical media, are less accurate than maximum likelihood detection if the equalizer for the ML detector is properly set to equalize to the target channel, but are capable of identifying a reasonable proportion of the signals when the samples are displaced from the expected amplitude.

Referring additionally to FIG. 1, the present invention comprises an adapter and a calibration system 34 for adapting a programmable digital maximum likelihood detector to a variable channel output and for calibrating a programmable digital maximum likelihood detector from unknown data in a known code at a variable channel output. The adapter may identify the digital samples of the recorded analog signals corresponding to one of the maximum likelihood states by means of feedback 35 from the maximum likelihood detector 18 for adapting the maximum likelihood detector, or by means of a non-maximum likelihood detector 36 for adapting the maximum likelihood detector 18 and/or calibrating the detector. Examples of non-maximum likelihood detectors 36 are digital peak detectors for magnetic tape media, and digital threshold detectors for optical media.

As will be seen, the higher error rates of the feedback of the maximum likelihood detector 18 when identifying displaced digital samples 31, or of the non-maximum likelihood detector 36 when identifying displaced digital samples 32 are reduced in importance by the present invention.

Figure 6:
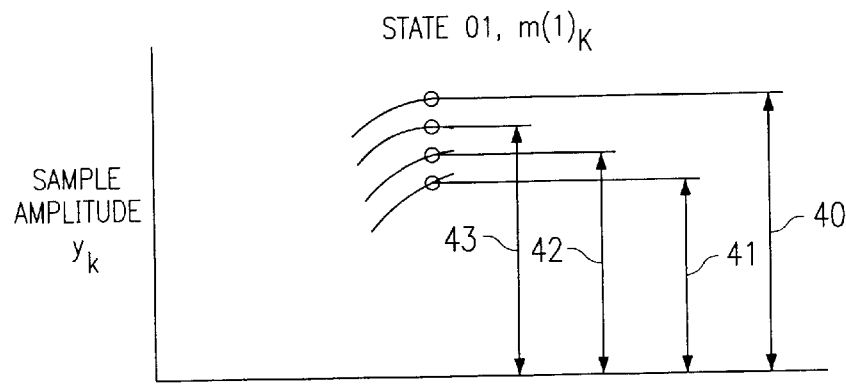
FIG. 6 is a diagram of an example of variable channel output of digital samples representing one maximum likelihood state.

Additionally referring to FIG. 6, in accordance with the present invention, each digital sample identified as corresponding to one of the maximum likelihood states is partially accumulated with prior digital samples previously identified as corresponding to the maximum likelihood state. Thus, FIG. 6 represents one example of a series of digital samples ($y_k$) 40–43. In the example, the samples are separately identified as corresponding to the maximum likelihood state "0–1", in which the present sample represents a "1" and the immediately preceding sample represents a "0" state.

In accordance with the present invention, when digital sample 41 is identified as corresponding to the "0–1" maximum likelihood state, it is partially accumulated by adapter/calibration system 34 with the previous accumulation which includes prior digital sample 40. Similarly, when digital sample 42 is identified as corresponding to the "0–1" maximum likelihood state, it is partially accumulated with the previous accumulation which includes prior digital samples 40 and 41. Further, when digital sample 43 is identified as corresponding to the "0–1" maximum likelihood state, it is partially accumulated with the previous accumulation which includes prior digital samples 40, 41 and 42. A series of digital samples is thus accumulated for each of the corresponding maximum likelihood states.

The partial accumulation preferably comprises accumulating a fraction of each identified digital sample with 1 minus the fraction of the previous accumulation of the identified digital samples. The accumulation may be represented by the formula:

$A_k=(\alpha)(y_k)+(1-\alpha)(A_{k-1})$, where A represents the accumulation and α represents the fraction.

As an example, the fraction α may comprise $1/16$th. Thus, each digital sample in the accumulation starts at its highest importance to the accumulation, and is then continually reduced in importance by the fractional amount (1−α) as the next partial accumulation is made.

The partial accumulation in accordance with the present invention insures that no one digital sample will control the determination of the numerical coefficients, but at most will have an importance of $(\alpha)(y_k)$. Thus, even should the detected digital sample be erroneous, the resultant accumulation $(A_k)$ will be accurate.

Next, adapter/calibration system 34 employs the accumulated digital samples for each of the corresponding maximum likelihood states, to determine the numerical metric coefficients matching the accumulated samples to the maximum likelihood state, and sets (for calibration) or updates each provided numerical metric coefficient to a value related to the determined matching numerical coefficient. The determination of the matching numerical coefficients is made in accordance with the calculations of the incorporated Hutchins et al. '419 and '420 applications, employing the accumulated digital samples as the mean values of each of the sample points. The metric coefficient numerical values are then calculated for the accumulated sample values of the sample points, thereby providing the numerical coefficients, identified above as "$g_n$" and as "$P_n$". As a specific example, in the equation where $g_1 = 2(\mu_0 - \mu_1)$ and $P_1 = -\mu_0^2 + \mu_1^2$, the accumulation value for $\mu_0$ is employed to process and calculate the numerical coefficients $g_1$ and $P_1$. The accumulation value for $\mu_0$ is also employed to calculate each of the numerical coefficients in which $\mu_0$ is a constituent. Thus, each accumulation is for a single sample point $\mu_n$, and each accumulation value affects all numerical coefficients which utilize the sample point.

Further in accordance with the present invention, if the media cannot be identified in advance, the initial values of the coefficients may be set to a null or to assumed generalized values, and α set to a very high fraction, such as ¼, so that the coefficients are adjusted very quickly. Once the M/L detector is running smoothly, the α is reset to a normal value, such as $1/16$.

Also in accordance with the present invention, if the media does not change characteristics rapidly, but rather changes over a large string of recorded data, the step of determining the programmable numerical coefficients may comprise setting α to a very small fraction, such as $1/100$, or may comprise responding to every nth one of the accumulated digital samples.

Figure 7A:
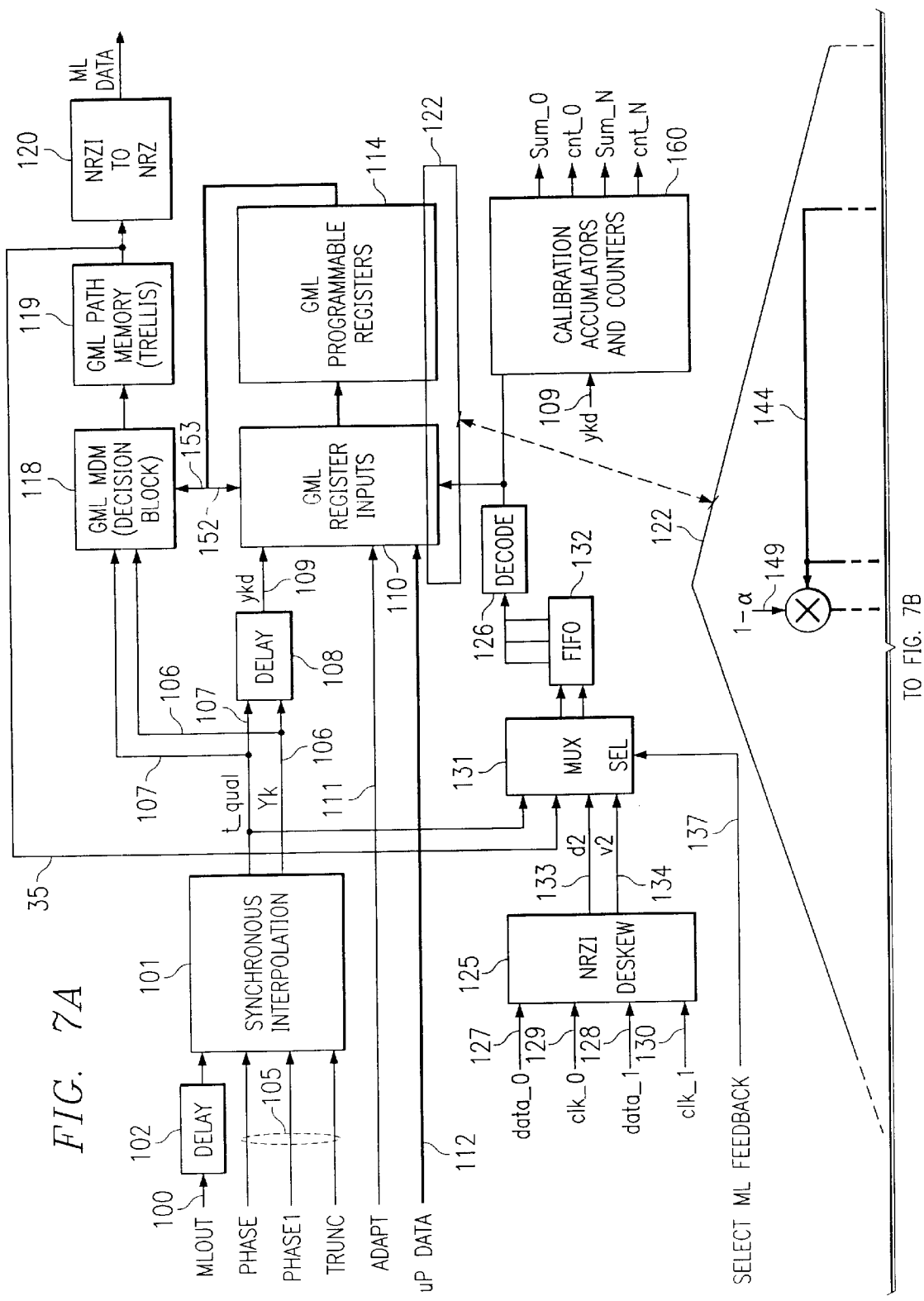
FIG. 7 is a block diagram representation of an embodiment of a maximum likelihood detector and adapter/calibration system of the present invention.
Figure 7B:
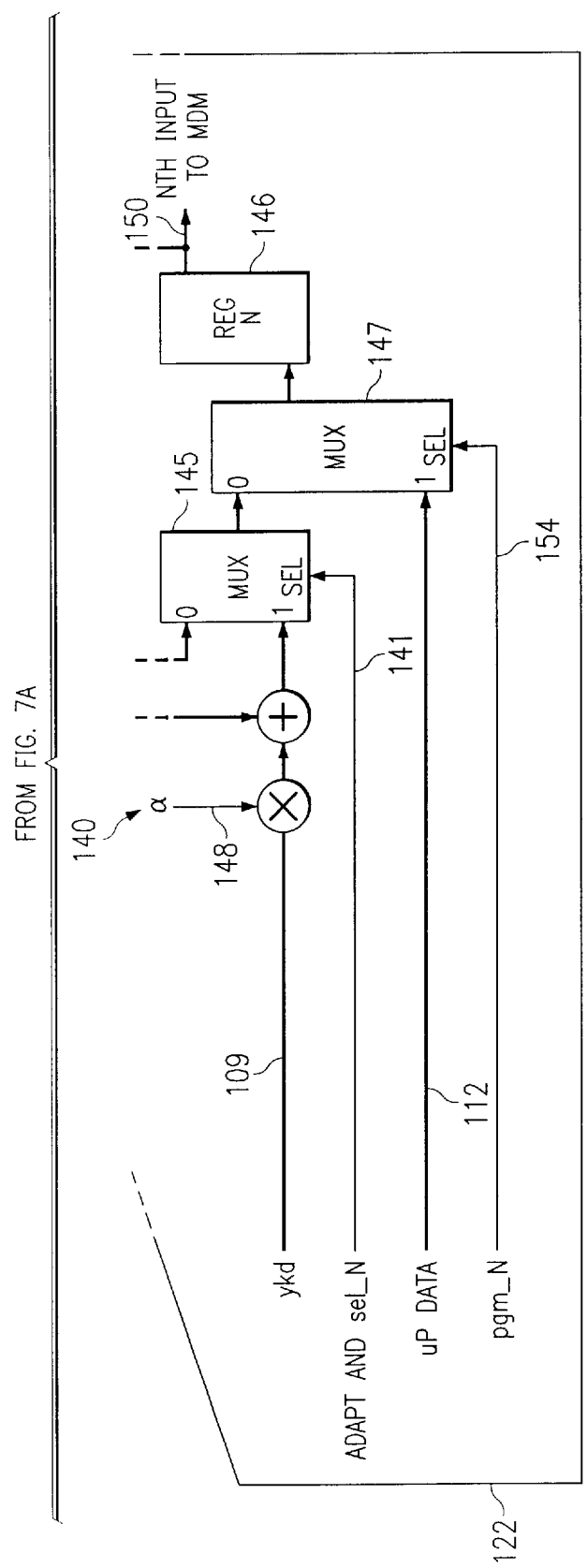
Figure 8A:
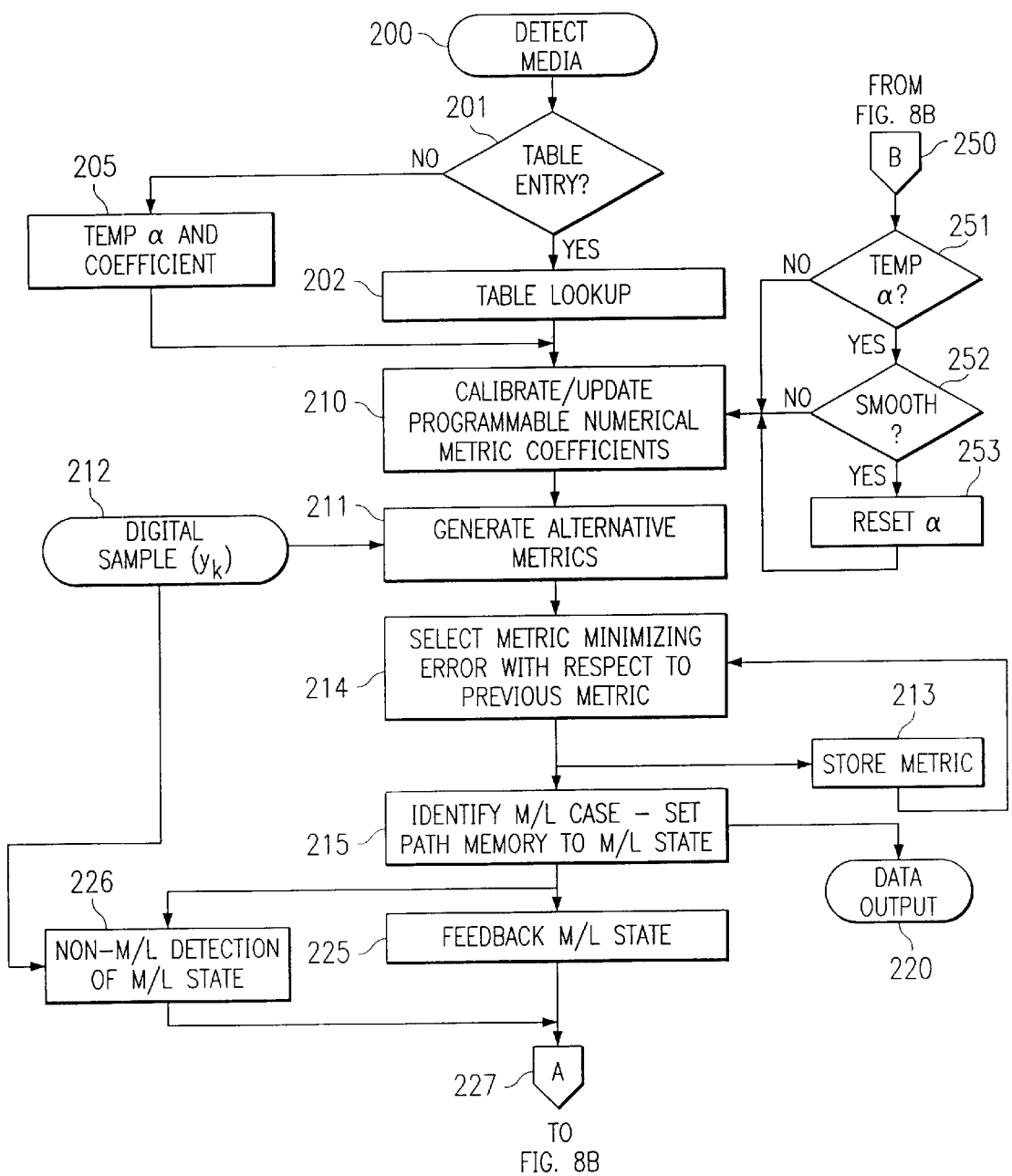
FIGS. 8A and 8B are a flow chart of embodiments of adaptive/calibration of maximum likelihood detection of the present invention.
Figure 8B:
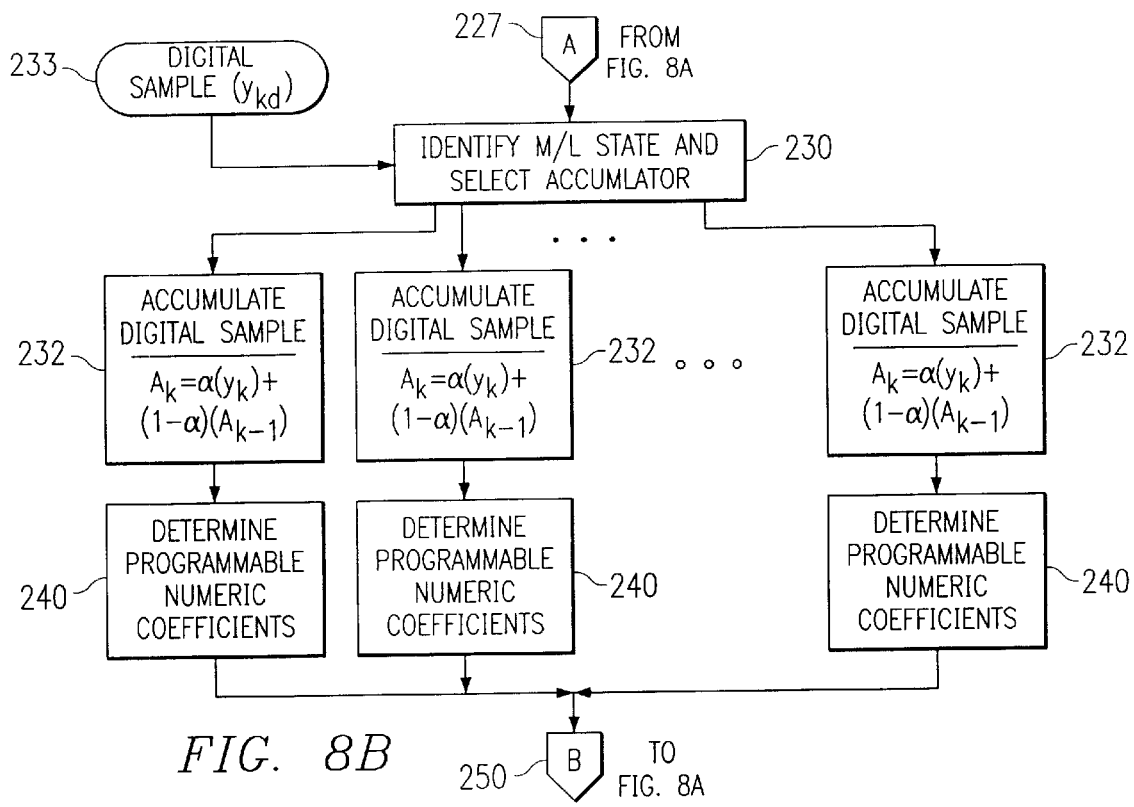

FIG. 7 illustrates an embodiment of a maximum likelihood detector and adapter/calibration system of the present invention, and FIGS. 8A and 8B illustrate embodiments of the method of adaptive/calibration of maximum likelihood detection of the present invention. The embodiment of FIG. 7 may be implemented by logic circuitry or in a computer processor, or by a combination.

Asynchronous digital samples may be provided from an equalizer (26 in FIG. 1) for the maximum likelihood detector at input 100, called "MLOUT" for output to the maximum likelihood detector. In the illustrated embodiment, the interpolation to the synchronous digital samples is conducted by an interpolator 101. It is also possible to equalize after interpolation. Thus, the asynchronous digital samples are delayed by delay 102 to match the propagation of clock signals which are supplied at inputs 105. Interpolator 101 employs the clock signals to provide the interpolation between asynchronous digital samples 100 to provide the estimated synchronous digital sample $y_k$ on line 106, which is the estimated signal amplitude at the point as the clock phase crosses a synthetic synchronous time boundary. A signal on line 107, called "t_qual", indicates that the digital sample on line 106 is valid and is "qualified". In a synchronous environment, such as many magnetic hard disk drives, interpolator 101 and delay 102 are not required, and the digital samples are provided directly on line 106. The synchronous digital sample $y_k$ is then provided to the M/L detector 118. The digital sample is also delayed to compensate for M/L state identification by delay 108, the delayed sample designated as $y_{kd}$.

In accordance with the incorporated Hutchins et al. '419 and '420 applications, the digital sample $y_k$ is supplied to the generalized maximum likelihood detector 118 at its sample inputs.

The maximum likelihood detector may operate as an adaptive maximum likelihood detector when enabled by a signal on line 111, or may operate as a non-adapting maximum likelihood detector with programmable coefficients, in accordance with the incorporated Hutchins et al. '419 and '420 applications if not enabled by a signal on line 111. The programmed numerical coefficients may be provided from a microprocessor on lines 112.

The numerical coefficients are provided to the programmable registers 114. The registers 114 and input 106 are provided to the sample logic of the multiple difference metric decision block 118 which also comprises the relational logic and selector of the incorporated Hutchins et al. '419 and '420 applications. The relational logic of block 118 provides a previous metric which comprises a difference metric function of a previous digital sample derived from difference metrics representing the difference between metrics directly associating "0" and "1" states of the recorded signal. The selector is coupled to the sample logic and to the relational logic for selecting the one of the respective generated alternative metrics which minimizes the mean squared error with respect to the previous metric and for selecting one of the derived difference metrics. Additionally, the selected derived difference metric comprises the previous metric for a following the digital sample. A maximum likelihood path memory 119 is coupled to the selector, for identifying the one of the finite number of maximum likelihood cases represented by the selected metric. The path memory responds to the identified one of the finite cases and is set to a maximum likelihood state dictated by the identified one of the finite states, the set maximum likelihood state detecting the recorded analog signals. A decoder 120 is coupled to the maximum likelihood path memory for signaling the set maximum likelihood state, converting the state to the NRZ data.

For embodiments of the invention which accommodate AC PRML channels, such as class PR IV encoding and second order samples, and class Extended PR IV encoding and third order samples, the path memory 119 may be as long as 16.

In accordance with the present invention, one accumulator 122 is provided for each sample point $\mu_n$. The accumulators each comprises both a register input 110 and a programmable register 114 for each of the sample values. Once the accumulation is accomplished, the calculation of the coefficients is accomplished by the multiple difference metric decision block 118 in accordance with the incorporated Hutchins et al. '419 and '420 applications, calculating the metric coefficient numerical values for the accumulated values of the sample outputs for the corresponding maximum likelihood states.

First, the correct accumulator 122 must be selected for accumulating the synchronous digital sample $y_k$ as delayed, the delayed sample designated as $y_{kd}$. In accordance with the present invention, and referring additionally to FIG. 1, the adapter may identify the digital samples of the recorded analog signals corresponding to one of the maximum likelihood states by means of feedback 35 from the maximum likelihood detector 18, employing the maximum likelihood path memory 119, or by means of a non-maximum likelihood detector 36. Examples of non-maximum likelihood detectors 36 are digital peak detectors for magnetic tape media, and digital threshold detectors for optical media.

Additional delays of the digital sample $y_{kd}$ corresponding to one of the maximum likelihood states to the adapter 122 are required to compensate for the processing of the multiple difference metric decision block 118 and for the maximum likelihood path memory 119, or for the processing of the non-maximum likelihood detector 36. With the various delays, the sample is synchronized with the identification of the sample.

NRZI deskew 125 and decoder 126 determine the maximum likelihood state that corresponds to the digital sample of the recorded analog signals for selection of the correct adapter 122 for a non-maximum likelihood detector 36. The NRZI deskew synchronizes the actual digital sample from detector 36 from lines 127 and 128 to the data stream, with the clock signals on lines 129 and 130, and loads the data, via multiplexor 131, into FIFO buffer 132. For example, the data is provided on line 133, called "d2", and is indicated as valid for loading by a signal on line 134, called "v2". The moving sequence of data, including the most recent, is thus stored in the FIFO 132 and is provided to decoder 126. The decoder 126 interprets the sequence of data and determines the correct adapter 122 corresponding to one of the maximum likelihood states.

Alternatively, feedback 35 from the maximum likelihood detector may be employed to determine the maximum likelihood state that corresponds to the digital sample. The maximum likelihood feedback 35 is selected by a signal on line 137 which switches multiplexor 131 to gate the feedback 35 rather than non-maximum likelihood data 133. Qualification signal 107 sequences the maximum likelihood detector and is also employed to sequence the multiplexor 131 and FIFO buffer 132.

Logic 140 of the selected (Nth) one of the adapters 122 is selected by the decoder 126 and accumulates a fraction of the identified delayed digital sample $y_{kd}$ with 1 minus the fraction of a previous accumulation of the identified digital samples. As discussed above, the accumulation may be represented by the formula:

$$A_k = (\alpha)(y_k) + (1-\alpha)(A_{k-1}),$$

where A represents the accumulation and $\alpha$ represents the fraction.

The logic 140 thus may comprise an infinite impulse response filter (IIR) for filtering or averaging the identified digital samples. As is known to those of skill in the art, IIR filters may be implemented in fixed logic or programmed into programmable logic processors. As one example, the fraction $\alpha$ is set at input 148 and may comprise $\frac{1}{16}$th. Thus, each digital sample in the accumulation starts at its highest importance to the accumulation, and is then continually reduced in importance by the fractional amount $(1-\alpha)$, which is set at input 149, e.g., at $\frac{15}{16}$ths, as the next partial accumulation is made. Herein, the terms "accumulator", "accumulate", etc., also comprise "averager", "averaging", "filter", "filtering", etc.

In accordance with the present invention, the accumulation is made on a continuing basis for each identified digital sample and provided to the multiple difference metric decision block 118 to determine the matching one of the programmable numerical metric coefficients. In the above example, the identified digital samples may be accumulated to provide the accumulations $A_0$–$A_3$ for $\mu_0$–$\mu_3$ in the equations for determining the matching programmable numerical metric coefficients $g_1$–$g_6$ and $P_1$–$P_6$.

If the computation of the coefficients is relatively slow, only every nth digital sample may be accumulated under the control of input 141 for determining the programmable numerical metric coefficients matching the digital samples to the one of said maximum likelihood states. Thus, the required logic to conduct the partial accumulation and the logic of the multiple difference metric decision block 118 to determine the matching (N) programmable numerical metric coefficients may be relatively inexpensive and slow if desired.

Specifically referring to FIG. 7, multiplexor 145, when set to "0" recycles a previous accumulation of logic 140 for the Nth accumulator 122 at line 144 from register 146, and, when triggered by input 141, gates a new partial accumulation from logic 140 to multiplexor 147 and register 146. The accumulation is provided at output 150 to the multiple difference metric decision block 118.

As illustrated in FIG. 7, a single accumulator 122 may be employed for accumulation of sample values for the determination of certain programmable numerical metric coefficients matching one maximum likelihood state, or a plurality of accumulators 122 may provide an accumulation for each of a plurality of digital samples matching a plurality of maximum likelihood states. The feedback 144 of the accumulation of each of a plurality of accumulators 122 are depicted as lines 152, and the output 150 of the accumulation of each of the plurality of accumulators 122 are depicted as lines 153, which provide the accumulated digital samples to the multiple difference metric decision block 118 in accordance with the incorporated Hutchins et al. '419 and '420 applications, for calculating the metric coefficient numerical values for the accumulated values of the sample outputs for the corresponding maximum likelihood states.

Conventional calibration logic 160 is illustrated in FIG. 7 for the data detector employing the non-maximum likelihood detector, e.g., for averaging, and may be provided for initial calibration or for detection of the type of media and detection of the encoding format of the media so that the correct maximum likelihood equations and coefficients may be selected. Alternatively, signal 150 is a good estimate of the mean for the bit sequence. Thus, a mean may be generated without a full summer and counter by setting $\alpha$ to a low number and reading output 150, e.g., by a microprocessor.

Once the encoding format is determined, the numerical metric coefficients derived in accordance with the incorporated Hutchins et al. '419 and '420 applications and stored in a lookup table are selected when the portable media having the characteristics is identified as loaded into the device.

In accordance with the present invention, the adapters 122 of the present invention may also be utilized to adapt the maximum likelihood detector from the predetermined numerical coefficients. Thus, rather than directly providing the predetermined numerical coefficients, the mean values employed for determining the numerical coefficients are provided from the lookup table by the microprocessor at line 112 to multiplexor 147. Input 154 then operates multiplexor 147 to gate the table lookup value to register 146, and the output of the register comprises the feedback on line 144 to be partially accumulated by logic 140 with the digital sample provided on line 109.

Thus, the maximum likelihood detector is initially preset with the mean values which comprise the basis for the programmed numerical coefficients, and are then adapted by the digital samples.

Alternatively, the programmed numerical coefficients may be directly provided to the programmed registers of the multiple difference metric decision block 118 in accordance with the incorporated Hutchins et al. '419 and '420 applications, and the adapters 122 then selected by inputs on lines 141.

Additionally, the present invention provides maximum likelihood detection for media whose precise characteristics are unknown so that there are no predetermined numerical coefficients and therefore no table entries.

In either situation, the initial setting of the register 146 by the microprocessor at line 112 may thus be the assumed generalized values or null. In which case, $\alpha$ is initially set to a high fraction at input 148, such as ¼, and 1–$\alpha$ is initially therefore set to ¾ at input 149. Once the maximum likelihood detector is running smoothly, $\alpha$ is then reset to a normal value.

FIGS. 8A and 8B illustrate an embodiment of alternative methods in accordance with the present invention which may be implemented in the adapter of FIGS. 1 and 7.

In step 200, the type of media and the encoding format of the media are detected so that the correct maximum likelihood equations may be selected. Step 201 determines whether there is a table entry for the particular media. If there is an entry in the table, "YES", the table entries for the type of media are provided in step 202. As discussed above, the table entries may comprise either the mean values which comprise the basis for the programmed numerical coefficients which are entered by line 112 to multiplexor 147, or may comprise the programmed numerical coefficients which are directly provided to the programmed registers of the multiple difference metric decision block 118 in accordance with the incorporated Hutchins et al. '419 and '420 applications.

If there are no table entries for the type of media, or the type of media is undetectable, "NO" in step 201, but the encoding format is known, step 205 sets $\alpha$ and 1–$\alpha$ inputs 148 and 149 to temporary values and sets the multiplexor 147 to a null or a generalized value. Then, in step 210, the value of the multiplexor 147 in register 146 is supplied on output 150 and the detector calibrates or updates the programmable numerical coefficients in accordance with the incorporated Hutchins et al. '419 and '420 applications. Also in accordance with the incorporated Hutchins et al. '419 and '420 applications, the programmable numerical metric coefficients are applied in step 211 to each of the digital samples of step 212 to generate alternative metrics. In step 213, a stored previous metric is provided which comprises a function of a previous digital sample. In step 214, the one of the respective generated alternative metrics is selected which minimizes the mean squared error with respect to the previous metric of step 213. The selected metric is then stored in step 213. In step 215, the one of the finite number of maximum likelihood cases is identified which is represented by the selected metric of step 214. Also step 215, in response to the identified one of the finite maximum likelihood cases, sets the maximum likelihood path memory to a maximum likelihood state dictated by the identified one of the finite maximum likelihood cases. The set maximum likelihood state detects the recorded analog signals and the data represented by the recorded analog signals is provided at data output step 220.

In accordance with the present invention, as alternatives, the maximum likelihood state corresponding to the next digital sample $y_{kd}$ is provided either by feedback from the detected maximum likelihood state for that digital sample in step 225 or by detection by a non-maximum likelihood detector and decoder 126, in step 226. Connector 227 leads to the identification of the maximum likelihood state of step 225 or 226 in step 230. In step 230, the accumulator 122 for that identified maximum likelihood state is selected.

In step 232 at the selected accumulator 122, logic 140 partially accumulates the identified digital sample $y_{kd}$ from step 233 with the previous accumulation. As discussed above, the previous accumulation comprises an accumulation of the identified digital samples, alternatively comprises a value of steps 205 and 210, or alternatively comprises an initial mean value which comprises the basis for the programmed numerical coefficients of steps 202 and 210.

The accumulation of step 232, as discussed above, may be represented by the formula:

$$A_k = (\alpha)(y_k) + (1-\alpha)(A_{k-1}),$$

where A represents the accumulation and $\alpha$ represents the fraction.

The accumulation value is stored in register 146 and fed back to be partially accumulated with the following identified digital sample. Also as discussed above, each identified digital sample may be accumulated, or each nth digital sample may be accumulated.

In step 240, the multiple difference metric decision block 118 determines the programmable numeric coefficients from the output 150 in accordance with the incorporated Hutchins et al. '419 and '420 applications.

Connector 250 then connects to step 210 for calibration or updating of the programmable numerical metric coefficient determined in step 240.

Step 251 determines whether the $\alpha$ of step 232 was a temporary setting. If so, "YES", step 252 determines whether the last accumulated sample or all of the accumulated samples of seteps 232 have stabilized so that the maximum likelihood detector is running smoothly. This may be accomplished by counting the number of samples that have been accumulated, e.g., 100 of each sample point, or by measuring the changes in the accumulated values against thresholds. If the detector is not yet smooth, "NO" in step 252, the temporary $\alpha$ setting is maintained. If the detector is smooth, step 253 resets $\alpha$ to the normal setting. If only the last accumulated sample point is. tested in step 252, step 253 only resets $\alpha$ for that sample point. If all sample points were tested in step 252, then step 253 resets all $\alpha$ settings to normal.

Thus, the method and the adapter/calibration system of the present invention provides adaptable maximum likelihood detection and provides maximum likelihood detection for media whose precise characteristics are unknown or for which there are no predetermined numerical coefficients, so long as the encoding format is known and for which the maximum likelihood detector has implemented adapters 122.

Figure 9:
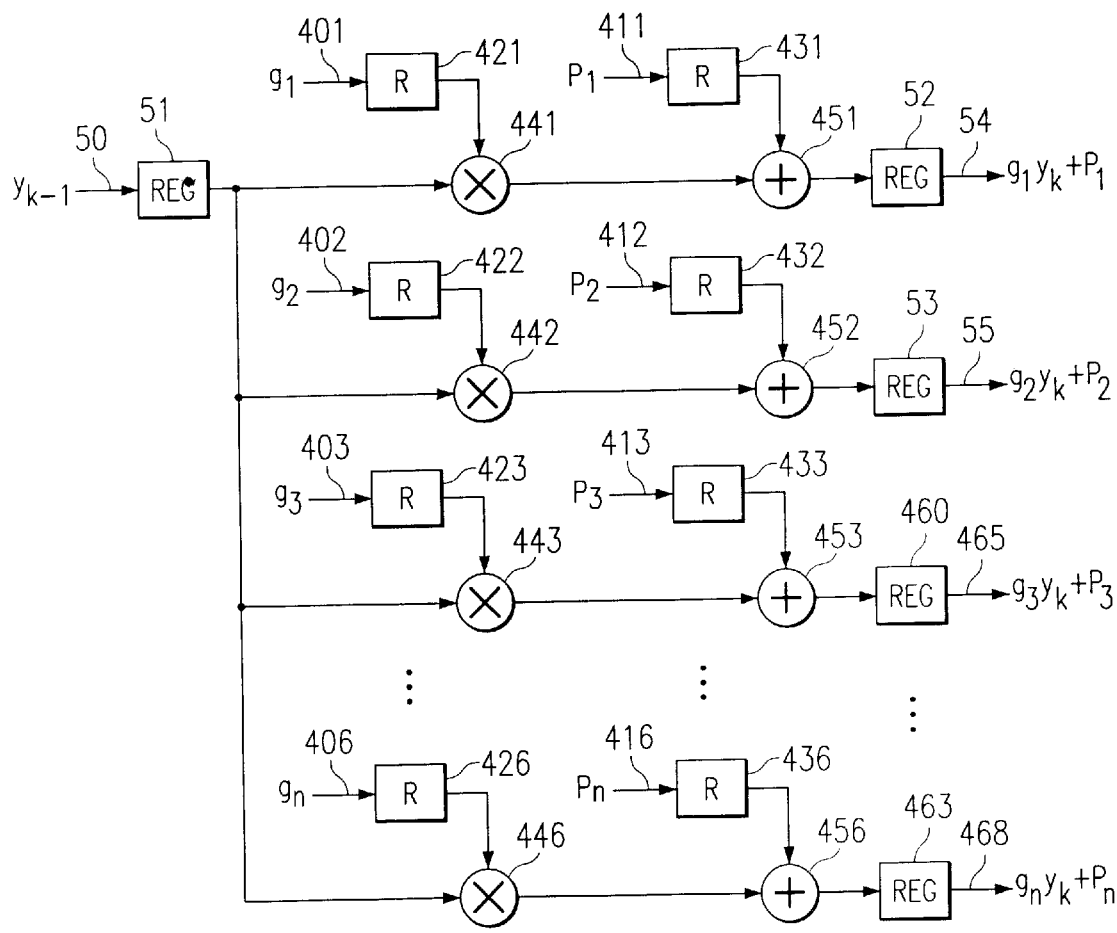
FIG. 9 is a block diagram of programming inputs and logic for applying programmed metric coefficients to digital samples of channel output signals to provide metrics thereof, in accordance with the embodiment of the present invention of FIG. 7.
Figure 10:
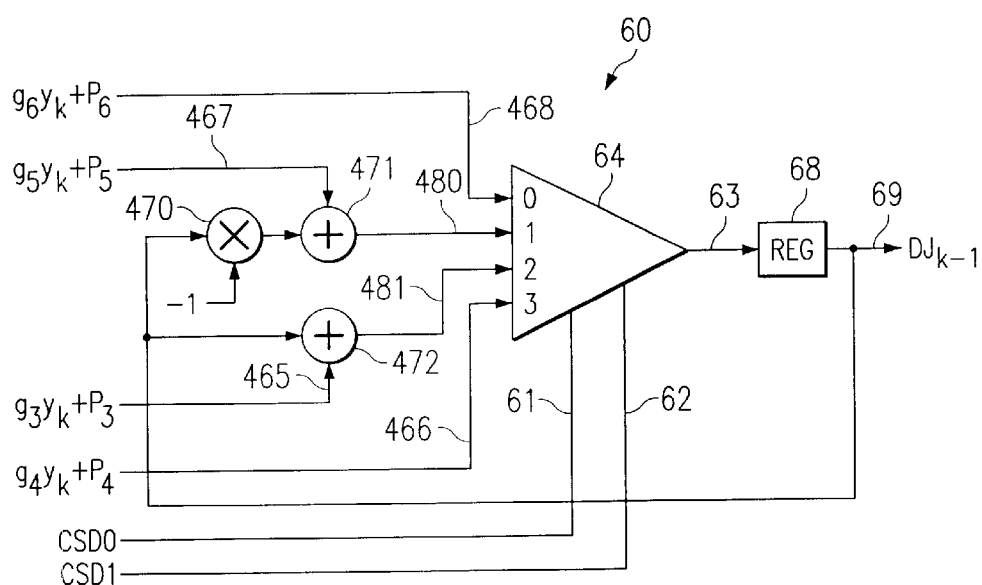
FIGS. 10 and 11 are block diagrams of logic for providing selected first order difference metrics from the metrics of the circuit of FIG. 9, and selecting the maximum likelihood branch which minimizes the mean squared error with respect to the previous finite maximum likelihood state, in accordance with the embodiment of the present invention of FIG. 7.
Figure 11:
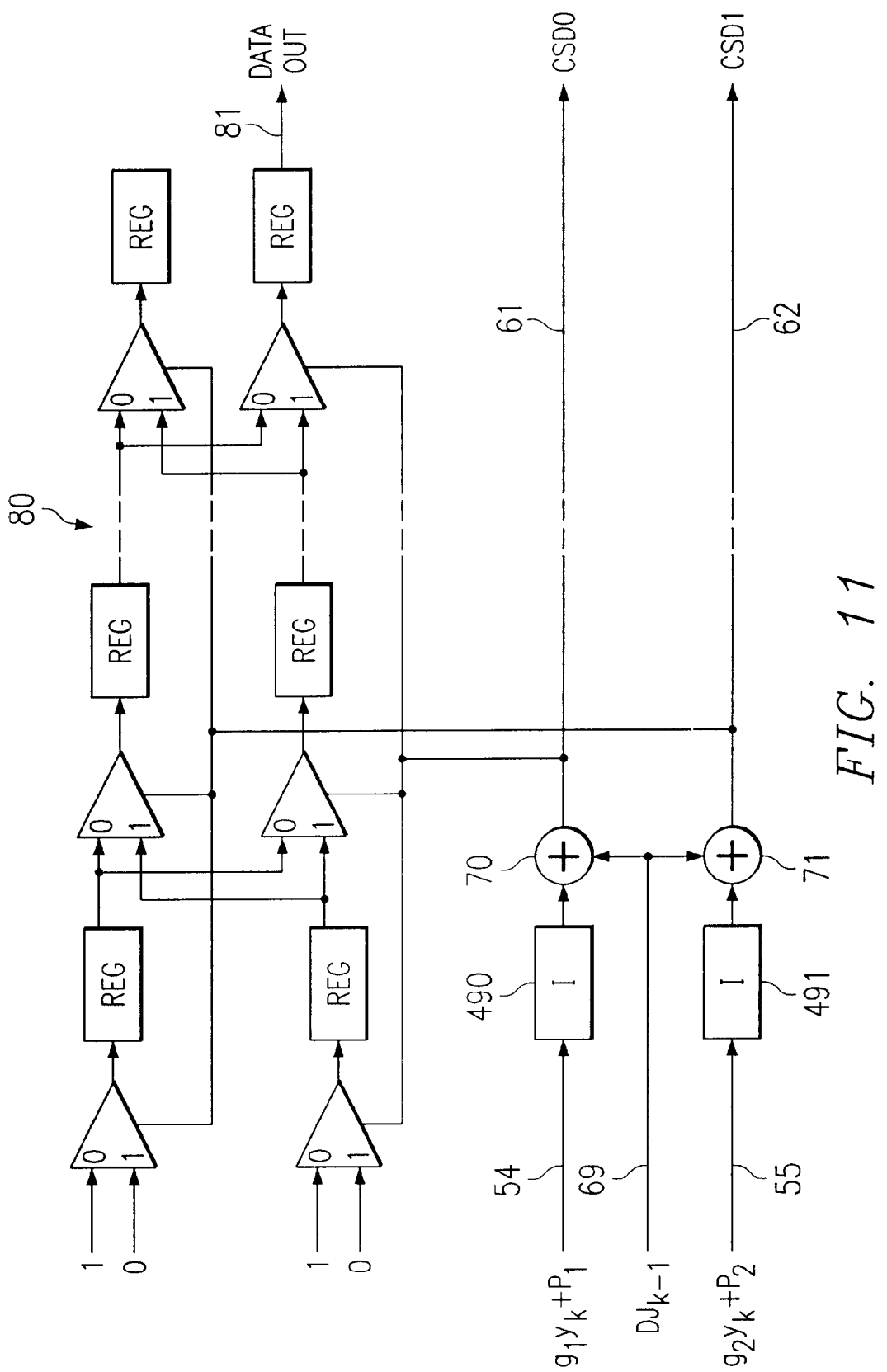

FIG. 9 is a block diagram of programming inputs and logic for applying programmed metric coefficients determined in accordance with the present invention to digital samples of channel output signals to provide metrics thereof; and FIGS. 10 and 11 are block diagrams of logic for providing selected first order difference metrics from the metrics of the circuit of FIG. 9, and selecting the maximum likelihood branch which minimizes the mean squared error with respect to the previous finite maximum likelihood state. The detector of FIGS. 9–11 is one embodiment of the incorporated Hutchins et al. '419 and '420 applications. The numerical metric coefficients are programmed, or set in accordance with the present invention, thereby adjusting the response of the maximum likelihood detector to the variable media.

In FIG. 9, programmed numerical metric coefficients of the present invention are provided at programming inputs 401, 402, 411 and 412, and comprise supplied programmed metric coefficients "$g_1$", "$g_2$", "$P_1$" and "$P_2$" which are supplied respectively to registers 421, 422, 431 and 432. The metric coefficients $g_1$ and $g_2$ are multiplier (product) metric coefficients, and the metric coefficients $P_1$ and $P_2$ are additive (offset) metric coefficients. The programmed metric coefficients are respectively applied by logic 441, 442, 451 and 452 to each digital sample of channel output signals $y_k$ supplied at input 50 and stored for a clock cycle in register 51. The application of the metric coefficients provides alternative metrics thereof at registers 52 and 53, respectively at outputs 54 and 55.

The alternative metrics are employed in a maximum likelihood detector for comparison to a function of the current sample and a prior selected metric in order to select the metric which minimizes the mean squared error with respect to the previous metric. Thus, the programming inputs 401, 402, 411 and 412 allow the alternative metrics to be adapted in accordance with the present invention to the samples which are being read.

Programming inputs 403–406 and 413–416 respectively supply programmed metric coefficients "$g_3$"–"$g_n$", "$P_3$"–"$P_n$" to registers 423–426 and 433–436, which are employed to calculate the various difference metrics for the various cases. Again, the metric coefficients $g_3$–$g_n$ are multiplier (product) metric coefficients, and the metric coefficients $P_3$ and $P_n$ are additive (offset) metric coefficients. The programmed metric coefficients are respectively applied by logic 443–446, 453–456 to each digital sample of channel output signals $y_k$ supplied at input 50 and delayed by register 51.

In the instant example, 4 sets of metric coefficients are employed to the calculation of 4 difference metrics for 4 possible cases. Thus, registers 460–463 respectively supply outputs 465–468 representing respectively, $g_3y_k+P_3$, $g_4y_k+P_4$, $g_5y_k+P_5$, and $g_6y_k+P_6$.

Since the metric coefficients "$g_1$"–"$g_n$" and "$P_1$"–"$P_n$" are derived from the difference between metrics directly associating "0" and "1" states of the recorded signal for first order maximum likelihood detection, this insures that no accumulation of metrics is unbounded, and there is never an overflow at the difference metric register.

The programmed metric coefficients "$g_1$"–"$g_6$" and "$P_1$"–"$P_6$" derived from the above are supplied, in FIG. 9, at programming inputs 401–406 and 411–416 to registers 421–426 and 431–436. The programmed metric coefficients are respectively applied by logic 441–446 and 451–456 to each digital sample $y_k$ supplied at input 50. The resultant outputs are stored in registers 460–463 and on outputs 465–468 to the logic of FIG. 10. In FIG. 10, the outputs 465–468 are further processed and selectively combined with a previous metric from register 68, by logic 470–472. Thus, the difference metrics are provided on inputs 468, 480, 481 and 466 to a multiplexor 64, the metric on line 481 representing case "0", on input 466 representing, for example, case "1", on input 480 representing case "2", and on input 468 representing case "3". As the result, the provided metrics are related to the alternative metrics and to the previous metric 68.

Use of the difference metrics and resultant difference metric coefficients allows a selector 60 of FIG. 10, which responds to the inputs at lines 61 and 62, to select as the difference metric "$DJ_k$" 63 at multiplexor 64 from between the calculated metrics of inputs 468, 480, 481 or 466 of multiplexor 64. The signals on lines 61 and 62 have binary values, which, when taken together, represent the four cases and operate the multiplexor 64 to gate the one of the outputs 465–468 represented by the particular case. The cases encoded by the state of the lines 61 and 62 from FIG. 11, a negative signal indicating a binary "1" and a positive signal indicating a binary "0", resulting in the two lines representing the four cases. The selection of one of the provided difference metrics of inputs 468, 480, 481 and 466, insures that the resultant metric on output 63 remains in defined bounds. The cases designated on lines 61 and 62 are generated by comparing the alternative metrics on inputs 54 and 55 to the previous difference metric.

The difference metric "$DJ_k$" 63 at multiplexor 64 is delayed in register 68 and supplied on output 69 after one delay time as "$DJ_{(k-1)}$" to adders 70 and 71 of FIG. 11. Each respective alternative metric "$g_1y_k+P_1$" and "$g_2y_k+P_2$" from outputs 54 and 55 is supplied to inverters 490 and 491 for multiplying by minus one and are added to the previous difference metric "$DJ_{(k-1)}$" 69 by adders 70 and 71 to provide the respective positive and negative states on outputs 61 and 62 which identify the one of the finite number of cases represented by the selected accumulated metric. Effectively, the adders 70 and 71 provide a comparison of the metrics to the previous difference metric. The states on outputs 61 and 62 are used to select the next difference metric "$DJ_k$" 63 at multiplexor 64, and are used to select a trellis path in path memory 80 to a maximum likelihood state dictated by the identified finite state. The path memory 80 may comprise the path memory 119 of FIG. 7, and provides the appropriate data bit at output 81 to decoder 120 for signaling the set maximum likelihood state, converting the state to the NRZ data.

In summary, metrics are calculated using equations involving both samples $y_k$ and coefficients. Comparisons are made, and a case is chosen as being the most likely, from the $y_k$ samples available at that point. But each case allows for one of two paths (see FIG. 4). The path memory then resolves the two paths down to one after sufficient time (synchronous clock periods) has passed. The key is that every case allows for that bit to be either a 0 or a 1 {right side of each case, m(1)k or m(0)k}. If there is a long string consisting of only Case 0 and Case 2, then the path memory cannot resolve which of two paths has occurred. Cases 1 and 3 however, give convergence and thus allow the path memory for PR IV or EPR IV—Cases 0 and 2 can occur for extended periods of time. Whereas in a baseline channel almost all transitions will map to Cases 1 and 3. In the context of adaption, the present invention estimates means with an IIR filter using detected (ML or otherwise) bits. With each noisy sample there is a new estimate of the mean, but not necessarily a better estimate (depends on the noise at the sample factored in). These estimates are then used to change the coefficients which change the metric equations used by the ML detector. Whereas ML detection itself gives a maximum likelihood or minimum square error estimation of a bit sequence, the estimation of the mean (or $\mu$) is not maximum likelihood.

The maximum likelihood detector of FIGS. 9–11 thus, in accordance with the present invention thus provides adaptable maximum likelihood detection for a variable channel, and provides maximum likelihood detection for media whose precise characteristics are unknown and there are no predetermined numerical coefficients.

Referring again to FIG. 5, the present invention calibrates and adapts the maximum likelihood detector so that it operates 33 towards the point of least sample displacement 37.

While the preferred embodiments of the present invention have been illustrated in detail, it should be apparent that modifications and adaptations to those embodiments may occur to one skilled in the art without departing from the scope of the present invention as set forth in the following claims.

I claim:

1. A method for maximum likelihood detection of digital samples of data recorded as analog signals representing a finite number of maximum likelihood states in accordance with a finite number of maximum likelihood sample-to-sample path cases, said digital samples representing channel output of the recorded analog signals at a predetermined timing with respect thereto, comprising the steps of:

providing at least two programmable numerical metric coefficients, said numerical metric coefficients relating to the probability of said digital samples comprising a data sequence;

respectively applying said at least two programmable numerical metric coefficients to each of said digital samples to generate alternative metrics;

providing a previous metric which comprises a function of a previous digital sample;

selecting the one of the respective generated alternative metrics which minimizes the mean squared error with respect to said previous metric;

identifying the one of the finite number of maximum likelihood cases represented by the selected metric;

responding to the identified one of said finite maximum likelihood cases, setting a maximum likelihood path memory to a maximum likelihood state dictated by said identified one of said finite maximum likelihood cases, the set maximum likelihood state detecting said recorded analog signals;

identifying ones of said digital samples corresponding to one of said maximum likelihood states;

partially accumulating the identified digital samples for said corresponding maximum likelihood states;

responding to the accumulated digital samples for said corresponding maximum likelihood states, determining at least one of the provided programmable numerical metric coefficients matching said digital samples to said one of said maximum likelihood states; and updating at least one said provided programmable numerical metric coefficient to a value related to said determined matching numerical coefficient.

2. The method of claim 1, wherein said step of identifying ones of said digital samples comprises identifying said digital samples as corresponding to said maximum likelihood state by feedback of each said maximum likelihood state.

3. The method of claim 1, wherein said partial accumulation step additionally comprises maintaining a separate accumulation of said identified digital samples for each said maximum likelihood state.

4. The method of claim 1, wherein said partial accumulation step comprises accumulating a fraction of each said identified digital sample with 1 minus said fraction of a previous accumulation of said identified digital samples.

5. The method of claim 4, wherein said fraction is initially set to a first value and subsequently reset to a second value.

6. The method of claim 1, wherein said step of identifying ones of said digital samples comprises identifying said digital samples as corresponding to said maximum likelihood state by other than the maximum likelihood detection.

7. The method of claim 1, wherein said partial accumulation step comprises accumulating every nth said identified digital sample, wherein n is greater than one.

8. A method for adapting a programmable digital maximum likelihood detector to a variable channel output; said maximum likelihood detector detecting digital samples of data recorded as analog signals representing a finite number of maximum likelihood states in accordance with a finite number of maximum likelihood sample-to-sample path cases, said digital samples representing said variable channel output of the recorded analog signals at a predetermined timing with respect thereto; said maximum likelihood detector providing at least two programmable numerical metric coefficients, said numerical metric coefficients relating to the probability of said digital samples comprising a data sequence; respectively applying said at least two programmable numerical metric coefficients to each of said digital samples to generate alternative metrics; providing a previous metric which comprises a function of a previous digital sample; selecting the one of the respective generated alternative metrics which minimizes a mean squared error with respect to said previous metric; identifying the one of the finite number of maximum likelihood cases represented by the selected metric; and responding to the identified one of said finite maximum likelihood cases, setting a maximum likelihood path memory to a maximum likelihood state dictated by said identified one of said finite maximum likelihood cases, the set maximum likelihood state detecting said recorded analog signals; said method comprising the steps of:

detecting a digital sample of said recorded analog signals corresponding to one of said maximum likelihood states;

partially accumulating the detected digital sample with prior the detected digital samples corresponding to said one of said maximum likelihood states;

responding to the accumulated digital samples, determining at least one of the provided programmable numerical metric coefficients matching said digital samples to said one of said maximum likelihood states; and updating said at least one of the provided programmable numerical metric coefficient to a value related to the determined matching numerical coefficient.

9. The method of claim 8, wherein said detecting step comprises detection of said digital sample as corresponding to said one of said maximum likelihood states by other detection than the maximum likelihood detection.

10. The method of claim 9, wherein said other detection comprises peak detection.

11. The method of claim 9, wherein said other detection comprises threshold detection.

12. The method of claim 8, wherein said partial accumulation step additionally comprises maintaining a separate accumulation of said detected digital samples for each said maximum likelihood state.

13. The method of claim 8, wherein said partial accumulation step comprises accumulating a fraction of each said detected digital sample with 1 minus said fraction of a previous accumulation of said prior detected digital samples.

14. The method of claim 13, wherein said fraction is initially set to a first value and subsequently reset to a second value.

15. The method of claim 8, wherein said detecting a digital sample step comprises detecting said digital samples as corresponding to said maximum likelihood state by feedback of each said maximum likelihood state.

16. The method of claim 8, wherein said partial accumulation step comprises accumulating every nth said detected digital sample, wherein n is greater than one.

17. A method for calibrating a programmable digital maximum likelihood detector from unknown data in a known code at a variable channel output; said maximum likelihood detector detecting digital samples of data recorded as analog signals representing a finite number of maximum likelihood states in accordance with a finite number of maximum likelihood sample-to-sample path cases in accordance with a known code, said digital samples representing said variable channel output of the recorded analog signals at a predetermined timing with respect thereto; said maximum likelihood detector providing at least two programmable numerical metric coefficients, said numerical metric coefficients relating to the probability of said digital samples comprising a data sequence; respectively applying said at least two programmable numerical metric coefficients to each of said digital samples to generate alternative metrics; providing a previous metric which comprises a function of a previous digital sample; selecting the one of the respective generated alternative metrics which minimizes a mean squared error with respect to the previous metric; identifying the one of the finite number of maximum likelihood cases represented by the selected metric; and responding to said identified one of said finite maximum likelihood cases, setting a maximum likelihood path memory to a maximum likelihood state dictated by said identified one of said finite maximum likelihood cases, the set maximum likelihood state detecting said recorded analog signals; said method comprising the steps of:

presetting at least one the provided programmable numerical coefficient to a predetermined value;

detecting digital samples of said recorded analog signals as corresponding to one of said maximum likelihood states, partially accumulating said detected digital samples for said corresponding maximum likelihood states;

responding to the accumulated digital samples for the corresponding maximum likelihood states, determining at least one of said provided programmable numerical metric coefficients matching said digital samples to the one of said maximum likelihood states; and setting said at least one provided programmable numerical metric coefficient to a value related to the determined matching numerical coefficient.

18. The method of claim 17, wherein said detecting step comprises detecting said digital samples as corresponding to said one of said maximum likelihood states by other detection than said maximum likelihood detection.

19. The method of claim 18, wherein said other detection comprises peak detection.

20. The method of claim 18, wherein said other detection comprises threshold detection.

21. The method of claim 17, wherein said partial accumulation step additionally comprises maintaining a separate accumulation of said detected digital samples for each said maximum likelihood state.

22. The method of claim 17, wherein said partial accumulation step comprises accumulating a fraction of each said detected digital sample with 1 minus said fraction of a previous accumulation of said detected digital samples.

23. The method of claim 22, wherein said fraction is initially set to a first value and subsequently reset to a second value.

24. The method of claim 17, wherein said detecting digital samples step comprises detecting said digital samples as corresponding to said maximum likelihood state by feedback of each said maximum likelihood state.

25. The method of claim 17, wherein said partial accumulation step comprises accumulating every nth said detected digital sample, wherein n is greater than one.

26. An adaptable maximum likelihood detector for detection of digital samples of data recorded as analog signals representing a finite number of maximum likelihood states in accordance with a finite number of maximum likelihood sample-to-sample path cases, the digital samples representing channel output of said recorded analog signals at a predetermined timing with respect thereto, comprising:

a sample input for receiving said digital samples of said recorded analog signals;

at least two programming sources for providing at least two numerical metric coefficients, said at least two numerical coefficients relating to the probability of said digital samples comprising a data sequence;

sample logic coupled to said sample input and to said at least two programming sources, for applying said at least two programmed numerical metric coefficients to each of said digital samples to generate alternative metrics;

relational logic coupled to said sample logic for providing a previous metric which comprises a difference metric function of a previous digital sample derived from difference metrics representing the difference between metrics directly associating "0" and "1" states of said recorded analog signals;

a selector coupled to said sample logic and to said relational logic for selecting the one of the respective generated alternative metrics which minimizes a mean squared error with respect to said previous metric and for selecting one of the derived difference metrics, whereby the selected derived difference metric comprises said previous metric for a following said digital sample;

a maximum likelihood path memory coupled to said selector, for identifying the one of said finite number of maximum likelihood cases represented by said selected metric, said path memory responding to said identified one of said finite cases to set to a maximum likelihood state dictated by said identified one of said finite cases, the set maximum likelihood state detecting said recorded analog signals;

an output coupled to said maximum likelihood path memory for signaling said set maximum likelihood state;

a detector identifying digital samples of said recorded analog signals as corresponding to one of said maximum likelihood states;

an accumulator coupled to said detector for partially accumulating the identified digital samples for the corresponding maximum likelihood states; and logic coupled to said accumulator and to at least one of said programming sources, employing the accumulated digital samples for said corresponding maximum likelihood states to determine at least one of the provided numerical metric coefficients matching said digital samples to said one of said maximum likelihood states, and updating the at least one provided numerical metric coefficient to a value related to the determined matching numerical coefficient.

27. The maximum likelihood detector of claim 26, wherein said detector identifying digital samples is coupled to said maximum likelihood path memory and identifies said digital samples as corresponding to said maximum likelihood state by feedback of each said maximum likelihood state.

28. The maximum likelihood detector of claim 26, wherein said accumulator comprises a plurality of digital accumulators, each separately maintaining an accumulation of said identified digital samples for each said maximum likelihood state.

29. The maximum likelihood detector of claim 26, wherein said accumulator accumulates a fraction of each said identified digital sample with 1 minus said fraction of a previous accumulation of said identified digital samples.

30. The maximum likelihood detector of claim 29, wherein said accumulator fraction is initially a first value and is subsequently reset to a second value.

31. The maximum likelihood detector of claim 26, wherein the digital sample detector comprises a non-maximum likelihood detector identifying said digital samples as corresponding to said maximum likelihood state by other than said maximum likelihood detection by said maximum likelihood detector.

32. The maximum likelihood detector of claim 26, wherein said accumulator accumulates every nth said identified digital sample, wherein n is greater than one.

33. An adapter for a programmable digital maximum likelihood detector for adapting said detector to a variable channel output; said detector detecting digital samples of data recorded as analog signals representing a finite number of maximum likelihood states in accordance with a finite number of maximum likelihood sample-to-sample path cases, said digital samples representing said variable channel output of the recorded analog signals at a predetermined timing with respect thereto, said detector comprising a sample input for receiving said digital samples of said recorded analog signals; at least two programming sources for providing at least two numerical metric coefficients, said at least two numerical coefficients relating to the probability of said digital samples comprising a data sequence; sample logic coupled to said sample input and to the at least one programming source, for applying said at least two programmed numerical metric coefficients to each of said digital samples to generate alternative metrics; relational logic coupled to said sample logic for providing a previous metric which comprises a difference metric function of a previous digital sample derived from difference metrics representing the difference between metrics directly associating "0" and "1" states of the recorded signal; a selector coupled to said sample logic and to said relational logic for selecting the one of the respective generated alternative metrics which minimizes a mean squared error with respect to said previous metric and for selecting one of the derived difference metrics, whereby the selected derived difference metric comprises said previous metric for a following said digital sample; a maximum likelihood path memory coupled to said selector, for identifying the one of said finite number of maximum likelihood cases represented by said selected metric, said path memory responding to said identified one of said finite cases to set to a maximum likelihood state dictated by said identified one of said finite cases, the set maximum likelihood state detecting said recorded analog signals; and an output coupled to said maximum likelihood path memory for signaling said set maximum likelihood state; said adapter comprising:

a detector detecting a digital sample of said recorded analog signals as corresponding to one of said maximum likelihood states;

an accumulator coupled to said detector for partially accumulating the detected digital sample with prior the detected digital samples corresponding to said one of said maximum likelihood states; and logic coupled to said accumulator and to at least one of said programming sources, employing said accumulated digital samples for said corresponding maximum likelihood states to determine at least one of said provided numerical metric coefficients matching said digital samples to said one of said maximum likelihood states, and updating the at least one provided numerical metric coefficient to a value related to the determined matching numerical coefficient.

34. The adapter of claim 33, wherein said detector detecting a digital sample comprises a non-maximum likelihood detector detecting said digital sample as corresponding to said maximum likelihood state by other than said maximum likelihood detection by said maximum likelihood detector.

35. The adapter of claim 34, wherein said detector detecting a digital sample comprises a peak detector.

36. The adapter of claim 34, wherein said detector detecting a digital sample comprises a threshold detector.

37. The adapter of claim 33, wherein said accumulator comprises a plurality of digital accumulators, each separately maintaining an accumulation of said detected digital samples for each said maximum likelihood state.

38. The adapter of claim 33, wherein said accumulator accumulates a fraction of each said detected digital sample with 1 minus said fraction of a previous accumulation of said prior detected digital samples.

39. The adapter of claim 38, wherein said accumulator fraction is initially a first value and is subsequently reset to a second value.

40. The adapter of claim 33, wherein said detector detecting a digital sample is coupled to said maximum likelihood path memory and detects said digital samples as corresponding to said maximum likelihood state by feedback of each said maximum likelihood state.

41. The adapter of claim 33, wherein said accumulator accumulates every nth said detected digital sample, wherein n is greater than one.

42. A calibration system for calibrating a programmable digital maximum likelihood detector from unknown data in a known code at a variable channel output; said detector detecting digital samples of data recorded as analog signals representing a finite number of maximum likelihood states in accordance with a finite number of maximum likelihood sample-to-sample path cases in accordance with said known code, said digital samples representing said variable channel output of the recorded analog signals at a predetermined timing with respect thereto, said detector comprising a sample input for receiving said digital samples of said recorded analog signals; at least two programming sources for providing at least two numerical metric coefficients, said at least two numerical coefficients relating to the probability of said digital samples comprising a data sequence; sample logic coupled to said sample input and to the at least one programming source, for applying said at least two programmed numerical metric coefficients to each of said digital samples to generate alternative metrics; relational logic coupled to said sample logic for providing a previous metric which comprises a difference metric function of a previous digital sample derived from difference metrics representing the difference between metrics directly associating "0" and "1" states of the recorded signal; a selector coupled to said sample logic and to said relational logic for selecting the one of the respective generated alternative metrics which minimizes a mean squared error with respect to said previous metric and for selecting one of the derived difference metrics, whereby the selected derived difference metric comprises said previous metric for a following said digital sample; a maximum likelihood path memory coupled to said selector, for identifying the one of said finite number of maximum likelihood cases represented by said selected metric, said path memory responding to said identified one of said finite cases to set to a maximum likelihood state dictated by said identified one of said finite cases, the set maximum likelihood state detecting said recorded analog signals; and an output coupled to said maximum likelihood path memory for signaling said set maximum likelihood state; said calibration system comprising:

a programmed input, presetting at least one said provided programmable numerical coefficient to a predetermined value;

a detector detecting digital samples of said recorded analog signals as corresponding to one of said maximum likelihood states;

an accumulator coupled to said detector for partially accumulating the detected digital samples for said corresponding maximum likelihood states; and logic coupled to said accumulator and to at least one of said programming sources, employing said accumulated digital samples for said corresponding maximum likelihood states to determine at least one of said provided numerical metric coefficients matching said digital samples to said one of said maximum likelihood states, and setting the at least one provided numerical metric coefficient to a value related to the determined matching numerical coefficient.

43. The calibration system of claim 42, wherein said detector is coupled to said maximum likelihood path memory and detects said digital sample as corresponding to said maximum likelihood state by other than said maximum likelihood detection by said maximum likelihood detector.

44. The calibration system of claim 43, wherein said detector detecting digital samples comprises a peak detector.

45. The calibration system of claim 43, wherein said detector detecting digital samples comprises a threshold detector.

46. The calibration system of claim 42, wherein said accumulator comprises a plurality of digital accumulators, each separately maintaining an accumulation of said detected digital samples for each said maximum likelihood state.

47. The calibration system of claim 42, wherein said accumulator accumulates a fraction of each said detected digital sample with 1 minus said fraction of a previous accumulation of said detected digital samples.

48. The calibration system of claim 47, wherein said accumulator fraction is initially a first value and is subsequently reset to a second value.

49. The calibration system of claim 42, wherein said detector detecting digital samples is coupled to said maximum likelihood path memory and detects said digital samples as corresponding to said maximum likelihood state by feedback of each said maximum likelihood state.

50. The calibration system of claim 42, wherein said accumulator accumulates every nth said detected digital sample, wherein n is greater than one.

\* \* \* \* \*